(12) United States Patent
Chae et al.

(10) Patent No.: US 12,181,532 B2
(45) Date of Patent: Dec. 31, 2024

(54) BATTERY SYSTEM DIAGNOSING APPARATUS AND METHOD

(71) Applicant: LG ENERGY SOLUTION, LTD., Seoul (KR)

(72) Inventors: Su-Hyun Chae, Daejeon (KR); Bom-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/018,789

(22) PCT Filed: Jan. 4, 2022

(86) PCT No.: PCT/KR2022/000095
§ 371 (c)(1),
(2) Date: Jan. 30, 2023

(87) PCT Pub. No.: WO2022/158757
PCT Pub. Date: Jul. 28, 2022

(65) Prior Publication Data
US 2023/0358819 A1    Nov. 9, 2023

(30) Foreign Application Priority Data
Jan. 19, 2021 (KR) .................. 10-2021-0007559

(51) Int. Cl.
*G01R 31/385* (2019.01)
*G01R 31/367* (2019.01)
(Continued)

(52) U.S. Cl.
CPC ......... *G01R 31/385* (2019.01); *G01R 31/367* (2019.01); *G01R 31/396* (2019.01); *H01M 10/4285* (2013.01); *H01M 10/482* (2013.01)

(58) Field of Classification Search
CPC .. G01R 31/385; G01R 31/396; G01R 31/367; H01M 10/482; H01M 10/4285
See application file for complete search history.

(56) References Cited

U.S. PATENT DOCUMENTS

| | | | |
|---|---|---|---|
| 2002/0109506 | A1 | 8/2002 | Kawakami et al. |
| 2011/0133757 | A1 | 6/2011 | Chae et al. |

(Continued)

FOREIGN PATENT DOCUMENTS

| | | |
|---|---|---|
| JP | 2002-50410 A | 2/2002 |
| JP | 2002-131402 A | 5/2002 |

(Continued)

OTHER PUBLICATIONS

Supplementary European Search Report for European Application No. 22742733.3, dated Mar. 18, 2024.
(Continued)

*Primary Examiner* — Minh Q Phan
(74) *Attorney, Agent, or Firm* — Birch, Stewart, Kolasch & Birch, LLP

(57) ABSTRACT

Disclosed is a battery diagnosing technology capable of effectively diagnosing a defective battery cell among a plurality of battery cells included in a battery system at an early stage. The battery system diagnosing apparatus diagnoses a battery system including a plurality of battery cells having electrode tabs therein, and includes a voltage measuring unit for measuring an end voltage at every charging or discharging for each of the plurality of battery cells; and a processor for accumulating the end voltage of each battery cell measured by the voltage measuring unit over time and detecting a battery cell having a defect in the electrode tab among the plurality of battery cells based on the accumulated end voltage trend.

10 Claims, 8 Drawing Sheets

(51) Int. Cl.
- *G01R 31/396* (2019.01)
- *H01M 10/42* (2006.01)
- *H01M 10/48* (2006.01)

(56) References Cited

U.S. PATENT DOCUMENTS

| | | |
|---|---|---|
| 2014/0028320 A1 | 1/2014 | Nakamura |
| 2014/0191728 A1 | 7/2014 | Kim |
| 2019/0033380 A1 | 1/2019 | Kim et al. |
| 2019/0033383 A1 | 1/2019 | Kamer et al. |
| 2020/0182944 A1 | 6/2020 | Han |
| 2020/0200834 A1 | 6/2020 | Uchino et al. |
| 2022/0242272 A1* | 8/2022 | Okamoto ................. B60L 58/21 |
| 2022/0334189 A1* | 10/2022 | Min ..................... G01R 31/388 |

FOREIGN PATENT DOCUMENTS

| | | |
|---|---|---|
| JP | 2004-144621 A | 5/2004 |
| JP | 2010-190818 A | 9/2010 |
| JP | 5692183 B2 | 4/2015 |
| JP | 2015-117995 A | 6/2015 |
| JP | 2017-75922 A | 4/2017 |
| JP | WO2019/058613 A1 | 1/2021 |
| KR | 10-2011-0062990 A | 6/2011 |
| KR | 10-2014-0141289 A | 12/2014 |
| KR | 10-1779245 B1 | 9/2017 |
| KR | 10-2019-0099686 A | 8/2019 |
| KR | 10-2064459 B1 | 1/2020 |

OTHER PUBLICATIONS

International Search Report for PCT/KR2022/000095 (PCT/ISA/210) mailed on Apr. 21, 2022.

* cited by examiner

BATTERY SYSTEM DIAGNOSING APPARATUS AND METHOD

TECHNICAL FIELD

The present application claims priority to Korean Patent Application No. 10-2021-0007559 filed on Jan. 19, 2021 in the Republic of Korea, the disclosures of which are incorporated herein by reference.

The present disclosure relates to a battery diagnosing technology, and more particularly, to a battery diagnosing technology capable of diagnosing a defective battery cell in a state of a battery system including a plurality of battery cells.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. Also, the lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

Generally, according to the shape of the exterior, lithium secondary batteries may be classified into a can-type secondary battery in which the electrode assembly is built into a metal can and a pouch-type secondary battery in which the electrode assembly is built in a pouch of an aluminum laminate sheet. In particular, the pouch-type secondary battery tends to be more widely used due to its advantages such as easy stacking and light weight.

The pouch-type secondary battery may be manufactured by injecting an electrolyte in a state where an electrode assembly is accommodated in a pouch exterior and then sealing the pouch exterior.

FIG. 1 is an exploded perspective view showing a general pouch-type secondary battery, and FIG. 2 is a perspective view showing the pouch-type secondary battery of FIG. 1.

As shown in FIGS. 1 and 2, the pouch-type secondary battery 1 may include an electrode assembly 20 and a pouch exterior 30 for accommodating the electrode assembly 20.

Here, the electrode assembly 20 has a basic structure including a positive electrode plate, a negative electrode plate, and a separator interposed therebetween, and may be accommodated in an inner space I formed inside the pouch exterior 30. At this time, the pouch exterior 30 may be formed with an upper pouch 31 and a lower pouch 32, and sealing portions S are provided on outer peripheral surfaces of the upper pouch 31 and the lower pouch 32, so that the sealing portions S are adhered to each other to seal the inner space I in which the electrode assembly 20 is accommodated.

Here, at least one positive electrode tab 11 and at least one negative electrode tab 12 may extend from the positive electrode plate and the negative electrode plate, respectively.

In addition, the positive electrode tab 11 and the negative electrode tab 12 may be coupled with plate-shaped electrode leads, namely a plate-shaped positive electrode lead 41 and a plate-shaped negative electrode lead 42, respectively. In addition, a portion of the positive electrode lead 41 and a portion of the negative electrode lead 42 may be exposed out of the pouch exterior 30 to provide an electrode terminal that is electrically connected to an external configuration of the secondary battery, for example another secondary battery or an external device.

As the field of application of secondary batteries has expanded, in recent years, secondary batteries are becoming widely used for driving or energy storage, not only in small devices such as portable electronic devices, but also in medium and large devices such as vehicles and energy storage systems (ESS). In the case of such a medium-large device, in order to increase output or capacity, a large number of secondary batteries may be electrically connected in series and/or in parallel. In particular, in the case of an energy storage system, a very large number of secondary batteries may be included. For example, the energy storage system may include a plurality of battery racks, and each battery rack may be configured to accommodate a plurality of battery modules in a rack frame. In addition, each battery module may include several secondary batteries, and each secondary battery may be referred to as a battery cell. Accordingly, the energy storage system may include a very large number of battery cells, for example thousands to tens of thousands of battery cells.

In the case of such a battery system, it is very important to diagnose the state of each battery cell. However, as the number of battery cells included therein increases, it is not easy to diagnose the state of a specific battery cell and detect a battery cell with a defect. Moreover, there may be many different types of failures for battery cells. For example, various problems such as exterior damage, separator damage, metal foreign material formation, electrolyte leakage, and tab defect may occur in the battery cell. Among them, the tab defect may be a defective type that occurs when at least one positive electrode tab 11 or negative electrode tab 12, namely the electrode tab 10, provided inside the battery cell is disconnected or cause a contact error. If such a tap defect occurs, the performance of the corresponding battery cell may be deteriorated or a malfunction may occur, and thus the performance and reliability of the battery system may be deteriorated as a whole. In addition, if a problem such as a tap defect occurs in a specific battery cell, the battery cell may ignite and cause a fire in the entire battery system.

Therefore, it is very important to identify which battery cell has a problem among the large number of battery cells included in the battery system and what type of defect has occurred. In particular, when a defective cell occurs, it is very important to diagnose such a defective cell at an early stage. However, an effective method for diagnosing such a defective battery cell and even diagnosing a specific defective type at an early stage has not yet been proposed.

DISCLOSURE

Technical Problem

The present disclosure is designed to solve the problems of the related art, and therefore the present disclosure is directed to providing a battery system diagnosing apparatus and method, which may effectively diagnose a defective battery cell among a plurality of battery cells included in a battery system at an early stage, and a battery system including the battery system diagnosing apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery system diagnosing apparatus, which diagnoses a battery system including a plurality of battery cells having electrode tabs therein, the apparatus comprising: a voltage measuring unit configured to measure an end voltage at every charging or discharging for each of the plurality of battery cells; and a processor configured to accumulate the end voltage of each battery cell measured by the voltage measuring unit over time to form an end voltage trend for each battery cell and detect a battery cell having a defect in one of the electrode tabs among the plurality of battery cells based on the accumulated end voltage trend.

Here, the processor may be configured to separately detect a disconnection defect and an incomplete contact defect as the defect of one of the electrode tabs.

In addition, the processor may be configured to obtain a deviation trend between the end voltage trend and a reference trend and detect whether each battery cell has the defect in one of the electrode tabs based on the obtained deviation trend.

In addition, the processor may be configured to obtain an average trend of the end voltages for the plurality of battery cells included in the battery system as the reference trend and compare the reference trend with the end voltage trend.

In addition, when the deviation trend is equal to or greater than a criterion deviation, the processor may be configured to detect that the corresponding battery cell among the plurality of battery cells has a disconnection defect.

In addition, when the case where the deviation trend is equal to or greater than a criterion deviation and the case where the deviation trend is equal to or less than the criterion deviation are repeated, the processor may be configured to detect that the corresponding battery cell among the plurality of battery cells has an incomplete contact defect.

In addition, the criterion deviation may include a first criterion deviation and a second criterion deviation.

In addition, the processor may be configured to detect whether each battery cell is defective by distinguishing a charging process and a discharging process.

In another aspect of the present disclosure, there is also provided a battery system, which comprises the battery system diagnosing apparatus according to the present disclosure.

In still another aspect of the present disclosure, there is also provided a battery system diagnosing method, which diagnoses a battery system including a plurality of battery cells having electrode tabs therein, the method comprising: measuring an end voltage at every charging or discharging for each of the plurality of battery cells; accumulating the end voltage of each battery cell measured in the measuring step over time to form an end voltage trend; and detecting a battery cell having a defect in the electrode tab among the plurality of battery cells based on the end voltage trend formed in the forming step.

Advantageous Effects

According to the present disclosure, in a battery system including a plurality of battery cells, it is possible to effectively diagnose a defective battery cell.

In particular, according to an embodiment of the present disclosure, it is possible to quickly detect a battery cell having a problem in the electrode tab among internal components.

Moreover, according to an embodiment of the present disclosure, it is possible to specifically classify the kind of problem that has occurred in the electrode tab.

Therefore, according to an embodiment of the present disclosure, appropriate follow-up measures such as separation, repair, replacement, or the like may be performed for a defective battery cell, particularly a battery cell having an abnormality in the electrode tab.

In addition, according to an embodiment of the present disclosure, since it is possible to obtain specific information on the defective type of the battery cell, so the battery cell manufacturing process may be appropriately modified based on the obtained information. Therefore, in this case, the defect rate of battery cells may be lowered.

In addition, the present disclosure may have various other effects, and these effects may be described in more detail below. In addition, with respect to each component, if any effect can be easily understood by those skilled in the art, such an effect will not be described in detail.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 3:
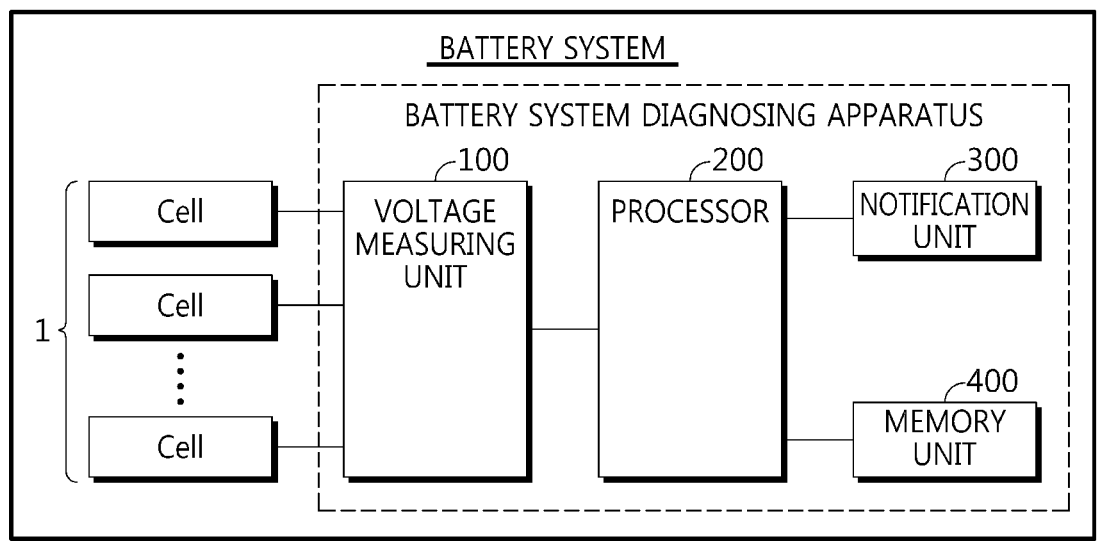
FIG. 3 is a block diagram schematically showing a functional configuration of a battery system diagnosing apparatus according to an embodiment of the present disclosure.

FIG. 3 is a block diagram schematically showing a functional configuration of a battery system diagnosing apparatus according to an embodiment of the present disclosure.

Figure 1:
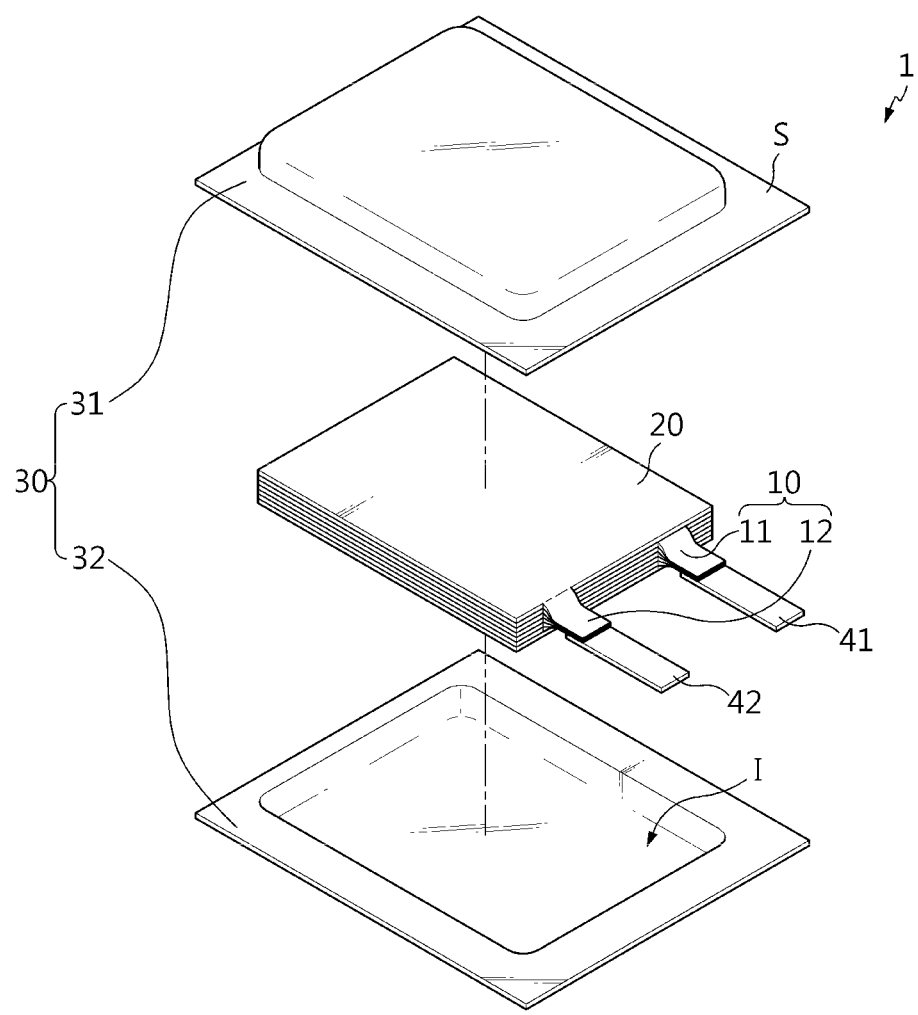
FIG. 1 is an exploded perspective view showing a general pouch-type secondary battery.
Figure 2:
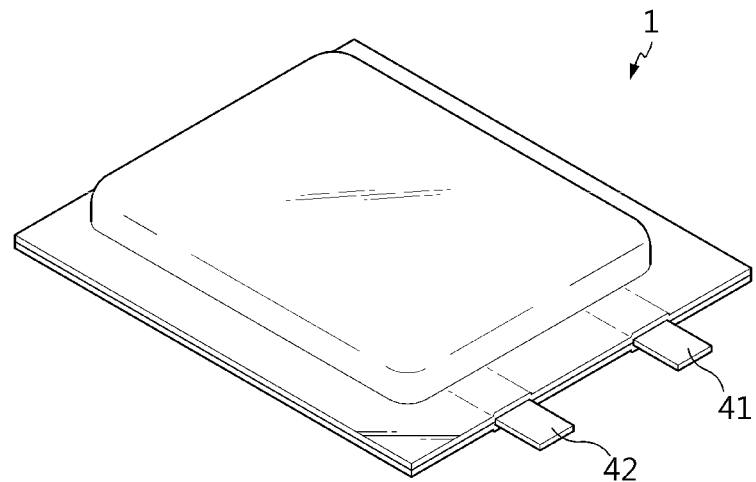
FIG. 2 is a perspective view showing the pouch-type secondary battery of FIG. 1.

As shown in FIG. 3, the battery system may include a plurality of battery cells 1. Here, the battery cell 1 may mean one secondary battery. The secondary battery may be a pouch-type secondary battery in which an electrode assembly 20 is accommodated in a pouch exterior 30 as shown in FIGS. 1 and 2, and the secondary battery may also be a can-type secondary battery in which the electrode assembly is accommodated in a cylindrical or prismatic metal can. The battery cell 1 that is a target to be diagnosed by the battery system diagnosing apparatus of the present disclosure may be selected from various secondary batteries known at the filing date of this application.

In particular, the battery cell 1 may include an electrode tab 10 therein. For example, referring to FIG. 1, the electrode assembly 20 of the battery cell 1 may include at least one positive electrode plate and at least one negative electrode plate. In addition, a positive electrode tab 11 and a negative electrode tab 12 may be provided to the positive electrode plate and the negative electrode plate, respectively. Also, the positive electrode tab 11 may be connected to a positive electrode lead 41, and the negative electrode tab 12 may be connected to a negative electrode lead 42. This is widely known in the filing date of this application, and thus the internal configuration of the battery cell 1 will not be described in detail here.

The battery system may include a plurality of such secondary batteries (battery cells). That is, the battery system is a system including a plurality of battery cells 1, and may refer to a system configured to charge and discharge an electric power. The battery system may include various types of systems such as a battery module, a battery pack, a battery rack, and an energy storage system (ESS). In particular, in the battery system, the plurality of secondary batteries may be electrically connected to each other in series and/or in parallel.

The battery system diagnosing apparatus according to the present disclosure can be regarded as an apparatus for diagnosing the battery system including the plurality of battery cells 1 having electrode tabs 10 therein as described above.

In particular, the battery system diagnosing apparatus according to the present disclosure may include a voltage measuring unit 100 and a processor 200.

The voltage measuring unit 100 may be configured to measure a voltage for each of the plurality of battery cells 1 included in the battery system. For example, the voltage measuring unit 100 may include a voltage sensor, and may be configured to measure the voltage at both ends of each battery cell 1 included in the battery system.

In particular, the voltage measuring unit may be configured to measure an end voltage at every charging or discharging. For example, the voltage measuring unit may be configured to measure a voltage (charging end voltage) whenever charging of each battery cell 1 ends. In addition, the voltage measuring unit may be configured to measure a voltage (discharging end voltage) whenever discharging of each battery cell 1 ends.

The battery system diagnosing apparatus according to the present disclosure may employ various voltage measuring devices or parts known at the time of filing of this application as the voltage measuring unit of the present disclosure. Therefore, the specific configuration of the voltage measuring unit will not be described in detail.

The processor 200 may be electrically connected to the voltage measuring unit to receive measured data from the voltage measuring unit. In particular, since the voltage measuring unit may measure the charging/discharging end voltage (the charging end voltage and/or the discharging end voltage) for each of the plurality of battery cells 1, the processor 200 may receive information on the voltage measured for each battery cell 1 in this way from the voltage measuring unit.

In addition, the processor 200 may be configured to accumulate the end voltage of each battery cell 1 transmitted in this way over time. The processor 200 may obtain a charging/discharging end voltage trend according to this accumulation. Here, the charging/discharging end voltage trend may be data continuously indicating charging/discharging end voltages obtained day by day in the form of a graph. For example, for each battery cell 1, the processor 200 may record each charging end voltage measured regularly or irregularly for each time and display the same as a point, and connect such points to obtain one line for each battery cell. At this time, the line obtained for each battery cell may be an end voltage trend line for the corresponding battery cell.

Figure 4:
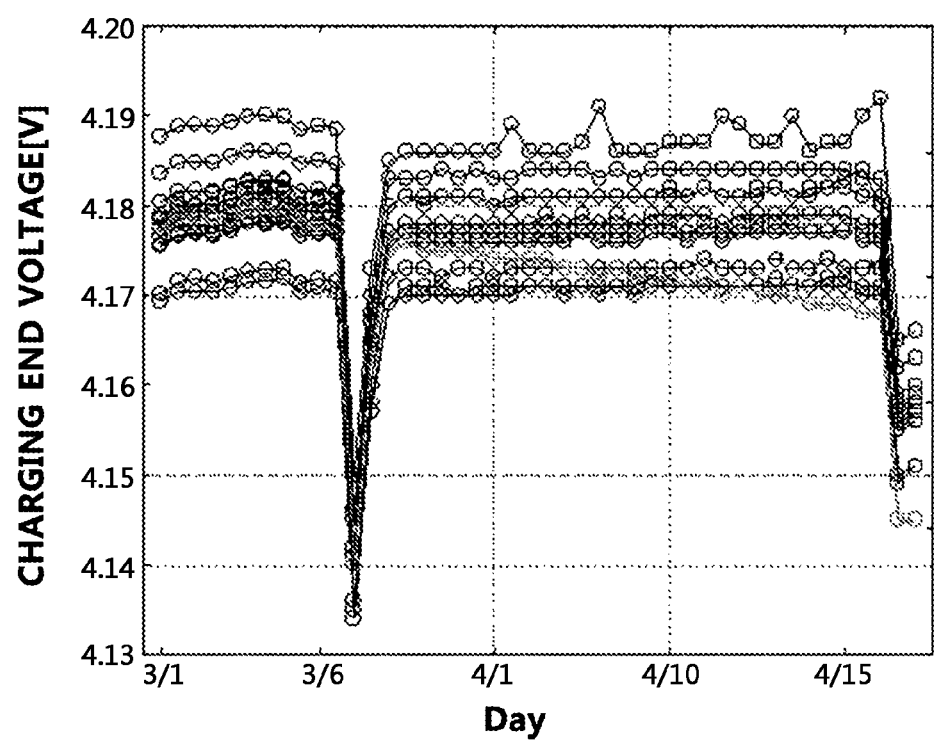
FIG. 4 is a graph showing a charging end voltage trend for a plurality of battery cells obtained by a processor according to an embodiment of the present disclosure.
Figure 5:
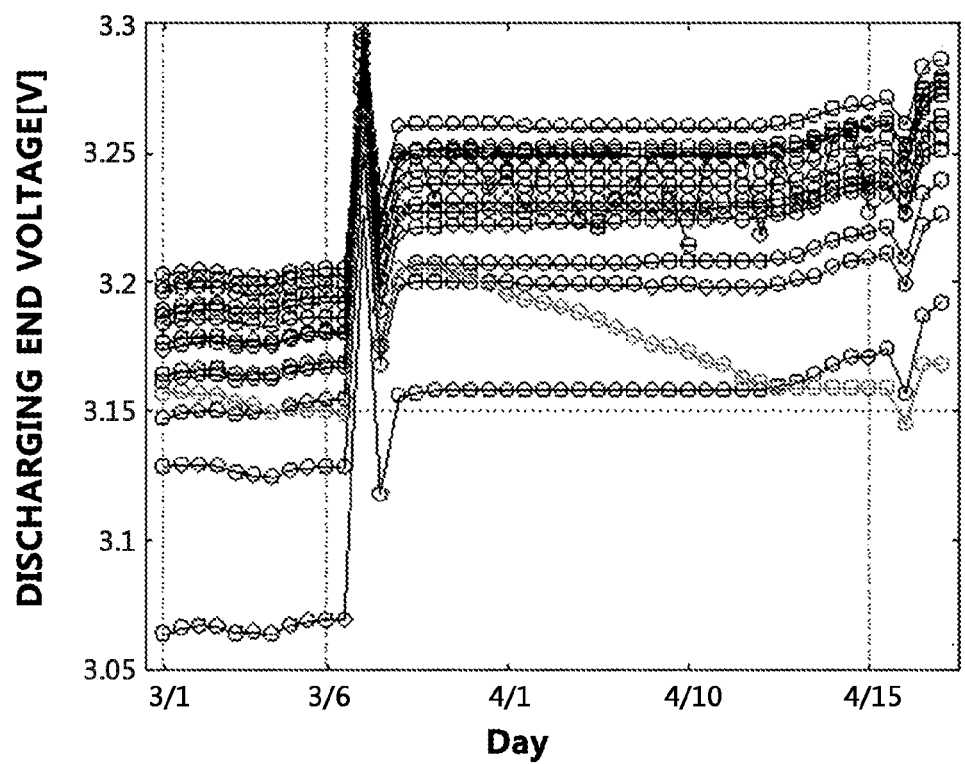
FIG. 5 is a graph showing a discharging end voltage trend for the plurality of battery cells obtained by the processor according to an embodiment of the present disclosure.

FIG. 4 is a graph showing a charging end voltage trend for the plurality of battery cells 1 obtained by the processor 200 according to an embodiment of the present disclosure, and FIG. 5 is a graph showing a discharging end voltage trend for the plurality of battery cells 1 obtained by the processor 200 according to an embodiment of the present disclosure.

First, referring to FIG. 4, the charging end voltage (EOC: End Of Charge) measured for a certain period (March to April) is displayed in the form of points for each date (time). Also, referring to FIG. 5, the discharging end voltage (EOD: End Of Discharge) measured for a certain period (March to April) is displayed in the form of points for each date (time). In addition, by connecting the end voltage points obtained for one battery cell to each other, it is possible to obtain an end voltage trend for each battery cell.

If the charging/discharging end voltages of each battery cell 1 are measured and transmitted from the voltage measuring unit, the processor 200 may accumulate the transmitted values to generate a charging end voltage trend line as shown in FIG. 4 or a discharging end voltage trend line as shown in FIG. 5.

In addition, the processor 200 may be configured to detect which battery cell 1 has a problem among the plurality of battery cells 1 included in the battery system based on the charging end voltage trend and/or the discharging end voltage trend generated as above. In particular, the processor

200 may be configured to detect a battery cell 1 having a defect in the electrode tab 10 based on the end voltage trend obtained for each battery cell 1. For example, as shown in FIG. 3, when a plurality of battery cells 1 are included in the battery system, the processor 200 may diagnose which battery cell 1 has a defect in the electrode tab 10 among the plurality of battery cells 1.

According to this configuration of the present disclosure, a defective battery cell 1 may be diagnosed early in a simple manner by using the charging/discharging end voltage of each battery cell 1. In particular, according to this configuration, it is possible to rapidly detect a battery cell 1 having a defect in the electrode tab 10. Accordingly, it is possible to effectively prevent problems caused by the defect of electrode tab 10, for example deterioration of overall performance, failure, or fire of the battery system.

The processor 200 may optionally include central processing units (CPUs), application-specific integrated circuits (ASIC), chipsets, logic circuits, registers, communication modems, data processing devices, or the like, known in the art, to execute various control logics performed in the present disclosure, or may be expressed using these terms. In addition, when a control logic is implemented in software, the processor 200 may be implemented as a set of program modules. In this case, the program module may be stored in an internal memory or an external memory or the like and executed by the processor 200.

In particular, if a control device that is referred to as a microcontroller unit (MCU) or a battery management system (BMS) is included in the battery system, the processor 200 may be implemented by components such as the MCU or the BMS provided.

Meanwhile, in this specification, terms such as 'to be' or 'configured to be' for an operation or function of the processor 200 may include the meaning of 'programmed to be'. In addition, the battery system diagnosing apparatus according to the present disclosure may further include a notification unit 300 as shown in FIG. 3.

The notification unit 300 may be configured to transmit the detection result by the processor 200 to a user or the like. For example, the notification unit 300 may include a display monitor, a speaker, a warning lamp, and the like, and display the defective cell detection result to the user in various ways, such as visual and auditory methods. In particular, the notification unit 300 may be configured to transmit information on which battery cell 1 has a defect in the electrode tab among the plurality of battery cells 1 included in the battery system, for example identification information or location information of a defective battery cell 1, to the user. In addition, the notification unit 300 may be connected to various wired or wireless communication networks known at the filing date of this application, and may be connected to a mobile terminal of the user or an external server. In this case, the notification unit 300 may transmit the defective cell detection information to the portable terminal or the server through a communication network.

In addition, the battery system diagnosing apparatus according to the present disclosure may further include a memory unit 400 as shown in FIG. 3.

The memory unit 400 may store programs and data necessary for the voltage measuring unit 100 or the processor 200 to perform its functions. That is, the memory unit 400 may store data or programs necessary for at least some components of the battery system diagnostic apparatus according to an embodiment of the present disclosure to perform operations and functions, or data generated in the process of performing the operations and functions. For example, the memory unit 400 may store a plurality of end voltages measured for each battery cell 1 for each time.

The memory unit 400 may adopt any information storage means known in the art to be capable of writing, erasing, updating and reading data, without limitation. As an example, the information storage means may include a RAM, a flash memory, a ROM, an EEPROM, a register, and the like. Also, the memory unit 400 may store program codes in which processes executable by the voltage measuring unit 100 and/or the processor 200 are defined.

The charging/discharging end voltage may be a voltage after a certain rest period passes from the end of charging/discharging.

For example, the charging end voltage may be an open circuit voltage (OCV) measured after a predetermined rest time is given, after the charging process for each battery cell 1 ends. In addition, the discharging end voltage may be an open circuit voltage (OCV) measured after a predetermined rest time is given, after the discharging process for each battery cell 1 ends.

According to this configuration of the present disclosure, a defective cell may be detected more effectively. In particular, when the same rest time is given after charging or discharging, abnormally degraded cells may not sufficiently recover voltage compared to other cells. Therefore, by comparing the voltages measured after giving a predetermined rest period, it is possible to more clearly distinguish a degraded cell and a normal cell.

The processor 200 may be configured to detect whether the defect of the electrode tab is a disconnection defect or an incomplete contact defect separately. Here, the disconnection defect may mean a state where one or more electrode tabs 10 included in the battery cell 1 is completely cut off at a specific part. For example, in the battery cell 1 including ten electrodes tabs 10, the disconnection defect may be a state where at least one electrode tab 10 is completely cut. The incomplete contact defect may mean a state where one or more electrode tabs 10 included in battery cell 1 is cut off at a specific part and then comes into contact repeatedly. For example, the incomplete contact defect may mean a state where there is a cut part in at least one electrode tab 10, but contact occurs intermittently at the cut part.

According to this configuration of the present disclosure, the electrode tab defect in the battery cell 1 is detected using the trend of the charging/discharging end voltage, and even the type of the electrode tab defect may be specifically diagnosed separately. Therefore, in this case, more appropriate measures may be taken according to the type of the electrode tab defect.

In particular, since the incomplete contact defect is a state where the cut portion of electrode tab 10 is repeatedly attached and detached, it may be predicted that a physical external force is applied to the electrode tab 10 or the battery cell 1. Therefore, in this case, it is possible to take a more appropriate action with respect to the external force applied to the corresponding battery cell 1. For example, when there is a battery cell 1 having an incomplete contact defect, the corresponding situation may be transmitted to the user through the notification unit 300. At this time, the user may identify the cause of the external force, and take appropriate measures to remove the cause of the external force, such as stopping the battery system or improving the fixing force of the rack frame.

The processor 200 can be configured to compare the end voltage trend of each battery cell 1 with a reference trend. Here, the reference trend may be data previously calculated or stored in order to be compared with an actual end voltage trend. In addition, the processor 200 may be configured to obtain a deviation trend by using a deviation between the end voltage trend and the reference trend. This will be described in more detail with reference to FIG. 6.

Figure 6:
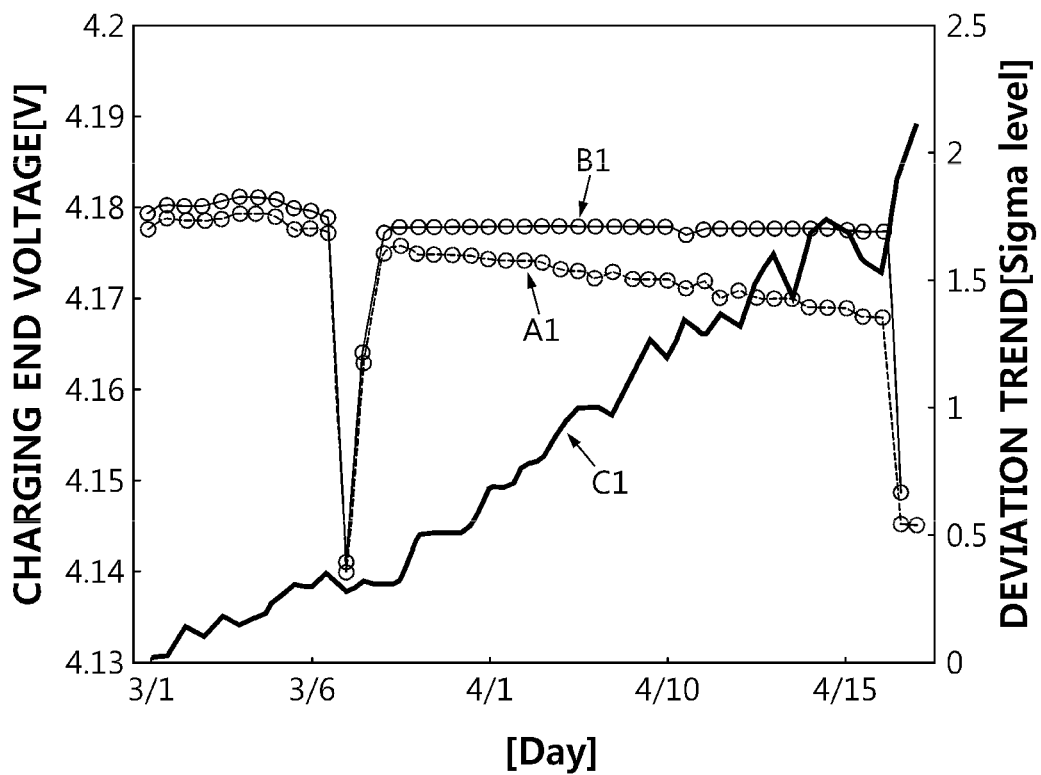
FIG. 6 is a graph showing an example of a deviation trend obtained according to an embodiment of the present disclosure.

FIG. 6 is a graph showing an example of a deviation trend obtained according to an embodiment of the present disclosure.

Referring to FIG. 6, the end voltage trend for a specific battery cell 1 is indicated by A1, and the reference trend is indicated by B1. In addition, the deviation trend obtained by comparing the end voltage trend A1 with the reference trend B1 is indicated as C1. The deviation trend C1 may be regarded as data for the specific battery cell 1, namely a battery cell 1 whose end voltage trend is measured as A1.

In particular, the deviation trend C1 is data that may be obtained by the difference between the end voltage trend A1 and the reference trend B1, and as shown in FIG. 6, may be expressed in the form of a sigma level. That is, the deviation trend C1 for the specific battery cell 1 may be expressed to show how much the end voltage trend A1 of the corresponding battery cell 1 is different from the reference trend B1.

As an example, the deviation trend C1 may be obtained in the following way. For example, it is assumed that, on a specific date, an average voltage value of all battery cells included in the battery system is Vm present in the B1 graph, a voltage standard deviation of all cells is Vs, and a voltage of the battery cell on the corresponding date corresponding to the A1 graph is V1. At this time, the deviation trend C1 on the corresponding date may be obtained in the following way.

$$C1=(Vm-V1)/Vs$$

That is, the deviation trend C1 of a specific cell may be calculated by subtracting the voltage value A1 of the corresponding cell from the overall average voltage value B1 and dividing it by the overall standard deviation.

Also, the deviation trend C1 may be displayed in various other forms. For example, the deviation trend C1 may be displayed as a value representing a voltage difference between the end voltage trend A1 and the reference trend B1. In this case, the unit of the deviation trend C1 may be expressed as mV or the like. The deviation trend C1 may also be expressed in various other forms indicating the difference between the end voltage trend A1 and the reference trend B1, and the present disclosure is not limited by the specific form or unit of the deviation trend.

If the deviation trend is obtained as above, the processor 200 may be configured to detect whether the electrode tab of the battery cell 1 is defective based on the obtained deviation trend. That is, if the deviation trend is obtained for the specific battery cell 1 as indicated by C1 in FIG. 6, the processor 200 may diagnose whether the electrode tab of the corresponding battery cell 1 is defective based on the size or shape of the deviation trend C1.

The processor 200 may be configured to obtain a deviation trend for all battery cells 1 included in the battery system. Alternatively, the processor 200 may be configured to obtain a deviation trend for some battery cells 1 included in the battery system.

For example, the processor 200 may be configured to obtain a deviation trend only for a battery cell 1 whose end voltage trend is less than or equal to a criterion value among all battery cells 1 included in the battery system. Alternatively, the processor 200 may be configured to obtain a deviation trend again only for the cells for which the deviation trend has been previously obtained, among all battery cells 1 included in the battery system. In this case, since it is not necessary to obtain a deviation trend for all battery cells 1, the calculation load of the processor 200 is lowered, so that the battery system may be diagnosed more efficiently.

The processor 200 may be configured to obtain an average trend of the end voltages for the plurality of battery cells 1 included in the battery system as a reference trend. For example, if a plurality of charging end voltage trend lines for the plurality of battery cells 1 are present as shown in FIG. 4, the average value for the plurality of charging end voltage trend lines may be regarded as a reference trend line as indicated by B1 in FIG. 6. As a more specific example, the reference trend may be obtained by extracting an average value whenever measuring an end voltage for the plurality of battery cells 1 and connecting the extracted average values to each other.

If the average trend of the end voltages for the plurality of battery cells 1 is obtained as above, the processor 200 may diagnose whether the electrode tab of the corresponding battery cell 1 is defective by comparing the obtained average trend with the end voltage trend of each battery cell 1.

Also, the processor 200 may judge whether the deviation trend is greater than or equal to a criterion deviation. Here, the criterion deviation is a value to be compared with the deviation trend, and may be regarded as a value serving as a criterion for judging whether the deviation trend is normal. The criterion deviation may be appropriately set according to the specifications or types of the battery system or the battery cell 1, the operating state of the battery system or various conditions. The criterion deviation may be stored in advance in the memory unit 400 or the processor 200.

Figure 7:
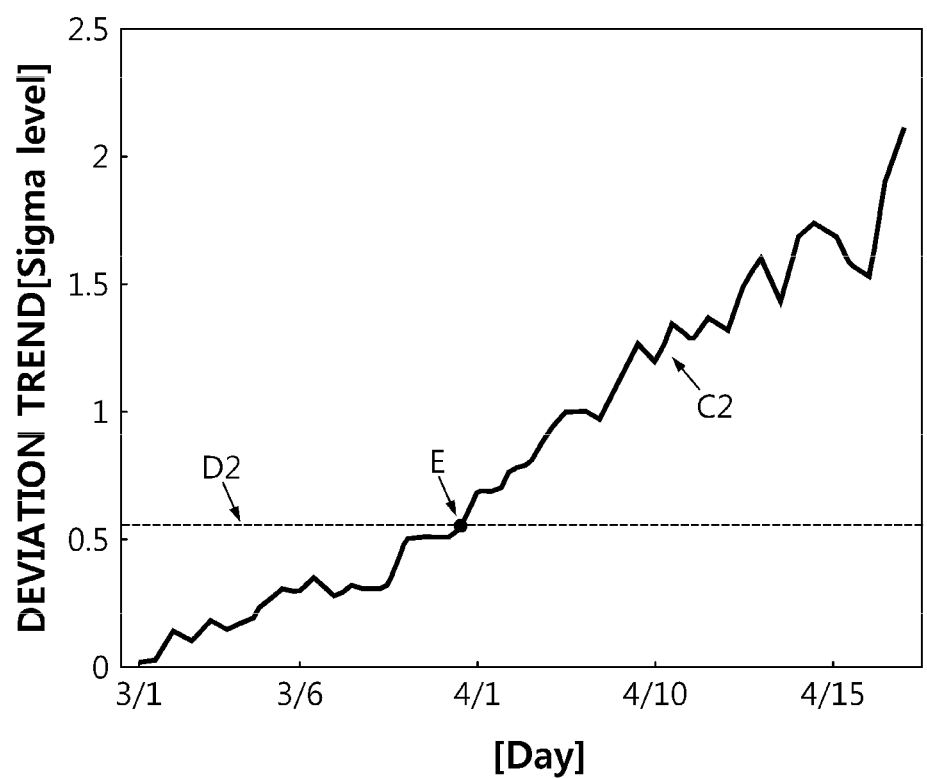
FIG. 7 is a graph showing a deviation trend and a criterion deviation of a specific battery cell according to an embodiment of the present disclosure.

FIG. 7 is a graph showing a deviation trend and a criterion deviation of a specific battery cell 1 according to an embodiment of the present disclosure.

Referring to FIG. 7, the deviation trend obtained for the specific battery cell 1 is indicated by C2. The method of obtaining the deviation trend is described above, and thus will not be described in detail again. In addition, in FIG. 7, the criterion deviation is indicated as D2 as a value to be compared with the deviation trend C2. The criterion deviation D2 may be stored in the memory unit 400 or the like and configured to be accessible by the processor 200.

The processor 200 may be configured to compare the deviation trend C2 and the criterion deviation D2, and detect that the corresponding battery cell 1 has a disconnection defect if the deviation trend C2 is equal to or greater than the criterion deviation D2. For example, in the embodiment of FIG. 7, the deviation trend C2 is formed higher than the criterion deviation D2 from the point indicated by E. Accordingly, the processor 200 may diagnose that a disconnection occurs in the electrode tab of the corresponding battery cell 1 at the point indicated by E.

According to this configuration of the present disclosure, by comparing the deviation trend obtained for the specific battery cell 1 with the criterion deviation, the disconnection defect of the battery cell 1 may be easily identified.

In particular, in this embodiment, if the case where the deviation trend is equal to or greater than the criterion deviation continues for a predetermined time or more, the processor 200 may detect that the corresponding battery cell 1 has a tap disconnection defect. For example, if the case where the deviation trend is equal to or greater than the criterion deviation continues for 3 days or more, the processor 200 may diagnose that the corresponding battery cell 1 has a tap disconnection defect.

According to this configuration of the present disclosure, it is possible to prevent that a tap disconnection defect is diagnosed even when the deviation trend is temporarily equal to or greater than the criterion deviation. Therefore, in this case, the accuracy of diagnosis may be further improved.

Meanwhile, in the embodiment of FIG. 7, it is illustrated that the criterion deviation is uniformly set regardless of the date (time), but the present disclosure is not necessarily limited to this form. In particular, the criterion deviation may be configured to be different according to the lapse of date (time).

First, the criterion deviation may be configured to gradually increase with the lapse of date. The battery cell 1 may be degraded as the number of uses increases. Therefore, even if there is no battery cell 1 having a defect in the electrode tab, the deviation between the battery cells 1 may gradually increase. Therefore, if the criterion deviation is configured to gradually increase as the date passes as in this embodiment, even when the battery cell 1 is degraded, a battery cell 1 having a defect in the electrode tab may be diagnosed more accurately.

Alternatively, the criterion deviation may be configured to be set differently according to the lapse of date, particularly for each season. For example, the period of one year may be classified into 4 quarters (March-May, June-August, September-November, and December-February), and the criterion deviation may be set differently for each classified quarter. In particular, according to this classification, in a country with distinct seasonal changes, the criterion deviation may be varied for each season. Since the battery cell 1 may have a change in the end voltage or the like according to the change in temperature, it is possible to more accurately diagnose whether the electrode tab is defective by reflecting this situation.

Alternatively, the criterion deviation may be configured to be set differently according to temperature. In this case, the battery system diagnosing apparatus according to the present disclosure may further include a temperature measuring unit (not shown). Accordingly, if the temperature inside or around the battery system is measured by the temperature measuring unit, the measured temperature information may be transmitted to the processor 200. Then, the processor 200 may set the criterion deviation according to the temperature information, and diagnose whether the deviation trend is abnormal according to the set criterion deviation. For example, the processor 200 may be configured to increase the criterion deviation in a case where the temperature is high, compared to a case where the temperature is low.

According to this configuration of the present disclosure, it is possible to more accurately diagnose an electrode tab defect by directly reflecting the temperature situation of the battery system.

Figure 8:
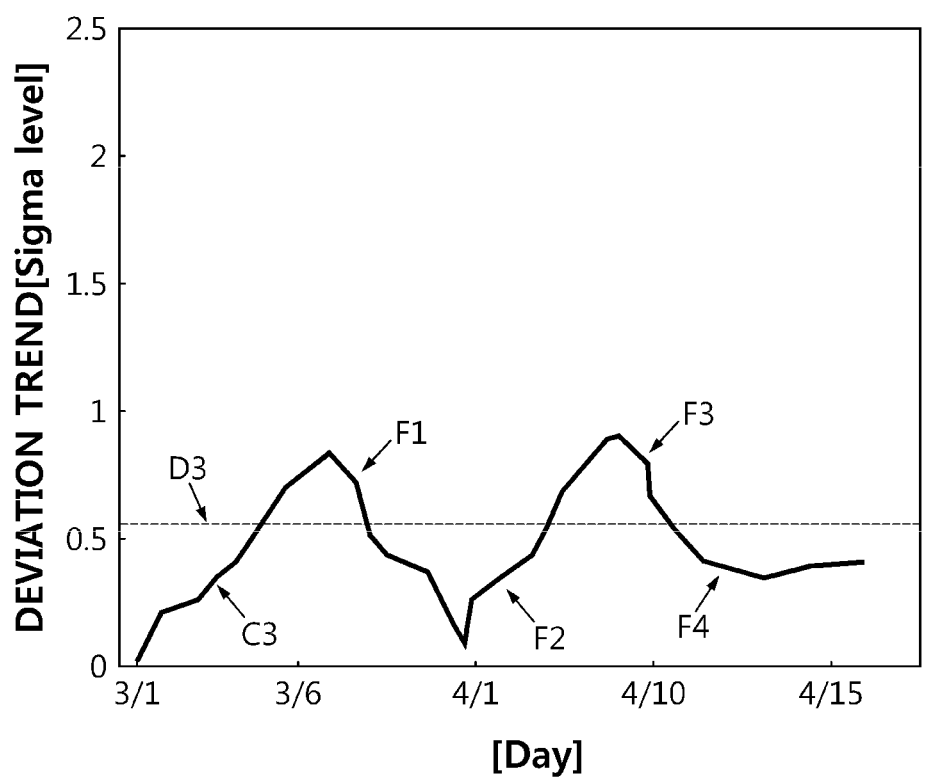
FIG. 8 is a graph showing a deviation trend and a criterion deviation of a specific battery cell according to another embodiment of the present disclosure.

FIG. 8 is a graph showing a deviation trend and a criterion deviation of a specific battery cell 1 according to another embodiment of the present disclosure. With respect to FIG. 8, features substantially identical or similar to those of the former embodiments, particularly the embodiment of FIG. 7, will not be described in detail.

Referring to FIG. 8, the deviation trend obtained for the specific battery cell 1 is indicated by C3. In addition, the criterion deviation is indicated by D3. In particular, the deviation trend C3 shows a pattern of repeatedly increasing and decreasing based on the criterion deviation D3. That is, the deviation trend C3 is higher than the criterion deviation D3 in the part indicated by F1, but the deviation trend C3 is lower than the criterion deviation D3 in the part indicated by F2. In addition, in the part indicated by F3, the deviation trend C3 is higher than the criterion deviation D3 again, and in the part indicated by F4, the deviation trend C3 is lower than the criterion deviation D3 again. That is, in the embodiment of FIG. 8, it may be regarded that the case where the deviation trend C3 is equal to or greater than the criterion deviation D3 and the case where the deviation trend C3 is equal to or less than the criterion deviation D3 appear repeatedly.

If the case where the deviation trend C3 is equal to or greater than the criterion deviation D3 and the case where the deviation trend C3 is equal to or less than the criterion deviation D3 are repeated as above, the processor 200 may be configured to detect that the corresponding battery cell 1 has an incomplete contact defect.

According to this configuration of the present disclosure, by comparing the deviation trend obtained for each battery cell 1 with the criterion deviation, an incomplete contact defect of the battery cell 1 may be easily identified.

In particular, the processor 200 may be configured to diagnose an incomplete contact defect, if the number of up/down switching of the deviation trend with respect to the criterion deviation is repeated a certain number of times or more.

For example, if the number of up/down switching of the deviation trend with respect to the criterion deviation is repeated three or more times during a predetermined period, for example within two months, the processor 200 may be configured to diagnose an incomplete contact defect. As an example, seeing the embodiment of FIG. 8, it may be regarded that the number of up/down switching of the deviation trend C3 with respect to the criterion deviation D3 for a period within 2 months is 3 times. In this case, since it may be regarded that the number of up/down switching (3 times) is repeated equal to or greater than the criterion number of times (3 times), the processor 200 may diagnose that the corresponding battery cell 1 has an incomplete contact defect. Meanwhile, if the number of up/down switching is only 2 times during the period, even if there is up/down switching of the deviation trend with respect to the criterion deviation, the processor 200 may not diagnose that the corresponding battery cell 1 has an incomplete contact defect.

According to this configuration of the present disclosure, an incomplete contact defect may be diagnosed more sophisticatedly by additionally imposing a condition for the number of switching.

Figure 9:
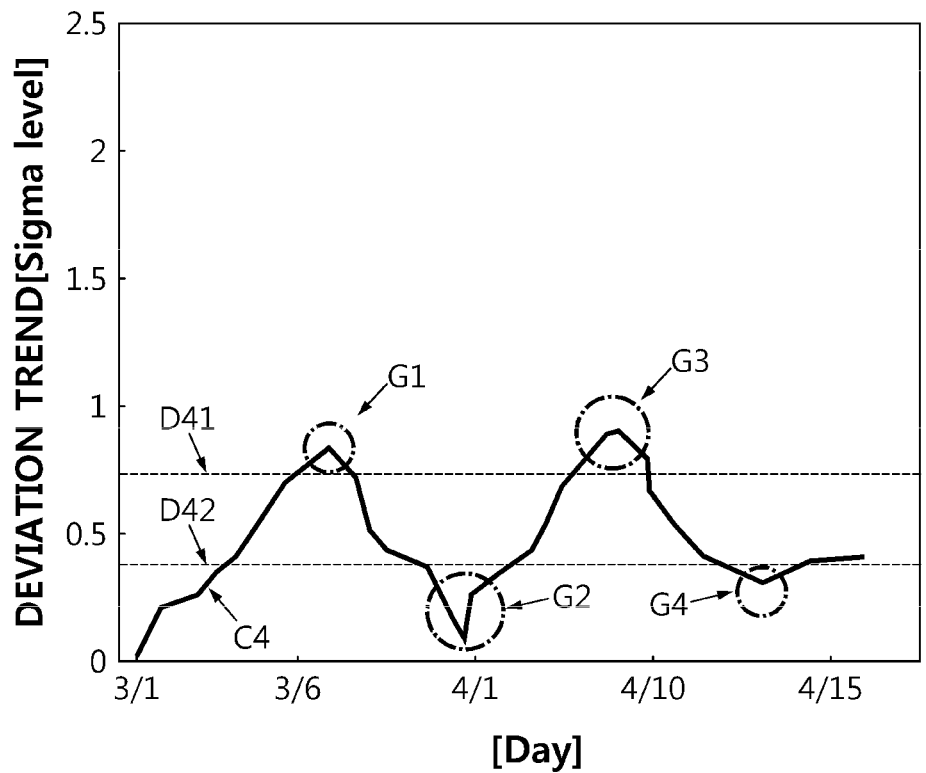
FIG. 9 is a graph showing a deviation trend and a criterion deviation of a specific battery cell according to still another embodiment of the present disclosure.

FIG. 9 is a graph showing a deviation trend and a criterion deviation of a specific battery cell 1 according to still another embodiment of the present disclosure. With respect to FIG. 9, features substantially identical or similar to those of the former embodiments will not be described in detail.

Referring to FIG. 9, the deviation trend obtained for the specific battery cell 1 is indicated by C4. In particular, in this embodiment, there are two criterion deviations. That is, the criterion deviations may include a first criterion deviation as indicated by D41 and a second criterion deviation as indicated by D42. Here, the second criterion deviation D42 may be set lower than the first criterion deviation D41.

In this embodiment, when the case where the deviation trend C4 is equal to or greater than the first criterion deviation D41 and the case where the deviation trend C4 is less than or equal to the second criterion deviation D42 are repeated a certain number of times or more, the processor 200 may judge that the corresponding battery cell 1 has an incomplete contact defect.

That is, in FIG. 9, the case where the deviation trend C4 is greater than or equal to the first criterion deviation D41 during the period is the same as indicated by G1 and G3, and the case where the deviation trend C4 is less than or equal to the second criterion deviation D42 is the same as indicated by G2 and G4. In this case, the number of up/down switching of the deviation trend C4 for with respect to the criterion deviation D41, D42 may be regarded as 3 times. In addition, the processor 200 judges whether the number of up/down switching is equal to or greater than the criterion number of times (e.g., 3 times), and judge that the corresponding battery cell 1 has an incomplete contact defect if up/down switching is repeated the criterion number of times or more.

According to this configuration of the present disclosure, an incomplete contact defect of the electrode tab may be detected more precisely. In particular, according to this embodiment, it is possible to prevent the problem that an incomplete contact defect is diagnosed even when the deviation trend repeats up/down switching in a level substantially similar to one criterion deviation.

In addition, the processor 200 may be configured to detect whether the battery cell 1 has a disconnection defect by comparing the end voltage trend with a threshold trend. Here, the threshold trend is a value to be compared with the end voltage trend, and may be regarded as a value serving as a criterion for judging whether the end voltage is abnormal.

For example, the threshold trend may be a value corresponding to 3 sigma or 6 sigma obtained from the plurality of end voltage data shown in FIG. 4 or 5. In particular, the graphs corresponding to 3 sigma or 6 sigma may be respectively located at a lower portion and an upper portion with respect to the average value of the end voltage for the plurality of battery cells 1. In this case, the threshold trend may be selected as a graph located in the lower portion of the graphs corresponding to 3 sigma or 6 sigma for the plurality of end voltage data.

In addition, if the end voltage trend is less than or equal to the threshold trend, particularly if the state where the end voltage trend is less than or equal to the threshold trend continues for a predetermined time or more, the processor 200 may be configured to detect that the corresponding battery cell 1 has a disconnection defect.

In addition, the processor 200 may be configured to compare the end voltage trend with the threshold trend, and detect that the corresponding battery cell 1 has an incomplete contact defect if the number of up/down switching of the end voltage trend with respect to the threshold trend continues a criterion number of times or more.

Also, the processor 200 may be configured to separately perform a charging process and a discharging process for each battery cell 1, when detecting a defective battery cell 1.

For example, for each battery cell 1, the processor 200 may be configured to separately process the end voltage trend obtained in the charging process and the end voltage trend obtained in the discharging process. In this case, the reference trend or the deviation trend described above may also be separately processed, managed, and/or stored for the charging process and the discharging process, respectively. For example, the reference trend for charging and the reference trend for discharging may be stored in the memory unit 400 separately and accessed by the processor 200.

According to this configuration of the present disclosure, since the charging process and the discharging process are separately compared, the state of the battery cell 1 may be diagnosed more accurately. In particular, the pattern of the end voltage of the battery cell 1 may be formed differently depending on whether it is in the state of charge or in the state of discharge, and according to this embodiment, the voltage trend may be diagnosed by reflecting this situation more appropriately. Therefore, the accuracy for diagnosing the electrode tab defect of the battery cell 1 may be further improved.

The battery system according to the present disclosure may include the battery system diagnosing apparatus according to the present disclosure. Here, the battery system may include various types of systems such as a battery module, a battery pack, a battery rack, a battery bank, and an energy storage system (ESS). That is, the battery system according to the present disclosure may be implemented in the form of a battery module having a plurality of battery cells 1 inside a module case, or may be implemented in the form of a battery pack having a plurality of battery modules. In addition, the battery system according to the present disclosure may be implemented in the form of a battery pack having a rack frame configured to stack a plurality of battery modules or battery packs and a plurality of battery modules or battery packs accommodated in the rack frame. Alternatively, the battery system according to the present disclosure may be implemented in the form of a battery bank including a plurality of battery racks. Alternatively, the battery system according to the present disclosure may be implemented in the form of an energy storage system including a plurality of battery banks.

Figure 10:
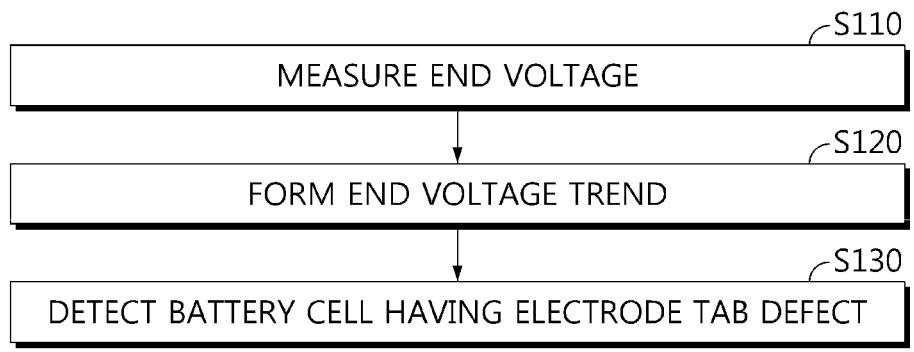
FIG. 10 is a flowchart for schematically illustrating a battery system diagnosing method according to an embodiment of the present disclosure.

FIG. 10 is a flowchart for schematically illustrating a battery system diagnosing method according to an embodiment of the present disclosure. In FIG. 10, each step may be performed by each component of the battery system diagnosing apparatus described above.

Referring to FIG. 10, the battery system diagnosing method according to the present disclosure is a method of diagnosing a battery system including a plurality of battery cells having electrode tabs therein, and may include an end voltage measuring step (S110), an end voltage trend forming step (S120), and a defective cell detecting step (S130).

First, in Step S110, for each of the plurality of battery cells, an end voltage may be measured for every charging or discharging.

Next, in Step S120, an end voltage trend may be formed by accumulating the end voltage of each battery cell measured in Step S110 over time.

And, in Step S130, a battery cell having a defect in the electrode tab may be detected among the plurality of battery cells based on the end voltage trend formed in Step S120.

For the details of the battery system diagnosing method according to the present disclosure, the features of the battery system diagnosing apparatus according to the present disclosure as described above may be applied in an identical or similar manner, and thus they will not be described in detail.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

1: battery cell
10: electrode tab
11: positive electrode tab, 12: negative electrode tab
20: electrode assembly
30: pouch exterior
31: upper pouch, 32: lower pouch 41: positive electrode lead, 42: negative electrode lead
100: voltage measuring unit
200: processor
300: notification unit
400: memory unit

What is claimed is:

1. A battery system diagnosing apparatus, which diagnoses a battery system including a plurality of battery cells having electrode tabs therein, the apparatus comprising:
    a voltage measuring unit configured to measure an end voltage at every charging or discharging for each of the plurality of battery cells; and
    a processor configured to accumulate the end voltage of each battery cell measured by the voltage measuring unit over time to form an end voltage trend for each battery cell and detect a battery cell having a defect in one of the electrode tabs among the plurality of battery cells based on the accumulated end voltage trend.

2. The battery system diagnosing apparatus according to claim 1,
    wherein the processor is configured to separately detect a disconnection defect and an incomplete contact defect as the defect of one of the electrode tabs.

3. The battery system diagnosing apparatus according to claim 1,
    wherein the processor is configured to obtain a deviation trend between the end voltage trend and a reference trend and detect whether each battery cell has the defect in one of the electrode tabs based on the obtained deviation trend.

4. The battery system diagnosing apparatus according to claim 3,
    wherein the processor is configured to obtain an average trend of the end voltages for the plurality of battery cells included in the battery system as the reference trend and compare the reference trend with the end voltage trend.

5. The battery system diagnosing apparatus according to claim 3,
    wherein when the deviation trend is equal to or greater than a criterion deviation, the processor is configured to detect that the corresponding battery cell among the plurality of battery cells has a disconnection defect.

6. The battery system diagnosing apparatus according to claim 3,
    wherein when the case where the deviation trend is equal to or greater than a criterion deviation and the case where the deviation trend is equal to or less than the criterion deviation are repeated, the processor is configured to detect that the corresponding battery cell among the plurality of battery cells has an incomplete contact defect.

7. The battery system diagnosing apparatus according to claim 6,
    wherein the criterion deviation includes a first criterion deviation and a second criterion deviation.

8. The battery system diagnosing apparatus according to claim 1,
    wherein the processor is configured to detect whether each battery cell is defective by distinguishing a charging process and a discharging process.

9. A battery system, comprising the battery system diagnosing apparatus according to claim 1.

10. A battery system diagnosing method, which diagnoses a battery system including a plurality of battery cells having electrode tabs therein, the method comprising:
    measuring an end voltage at every charging or discharging for each of the plurality of battery cells;
    accumulating the end voltage of each battery cell measured in the measuring step over time to form an end voltage trend; and
    detecting a battery cell having a defect one of the electrode tabs among the plurality of battery cells based on the end voltage trend formed in the forming step.

* * * * *